United States Patent [19]
Watanabe et al.

[11] Patent Number: 5,835,337
[45] Date of Patent: Nov. 10, 1998

[54] STACKED CAPACITOR HAVING A CORRUGATED ELECTRODE

[75] Inventors: Hirohito Watanabe; Ichiroh Honma, both of Tokyo, Japan

[73] Assignee: NEC Corporation, Tokyo, Japan

[21] Appl. No.: 723,274

[22] Filed: Sep. 30, 1996

[30] Foreign Application Priority Data

Sep. 29, 1995 [JP] Japan ................................. 7-254103

[51] Int. Cl.⁶ ................................................. H01G 4/30
[52] U.S. Cl. .................. 361/301.4; 361/303; 361/306.1; 257/306; 257/296
[58] Field of Search ............................ 361/301.4, 301.3, 361/303–305, 306.1, 306.3, 321.2, 321.4, 328, 322, 330; 438/253, 254, 255, 396, 397, 398, 631; 257/306, 307, 305, 303, 295, 296, 529

[56] References Cited

U.S. PATENT DOCUMENTS

| 5,142,639 | 8/1992 | Kohyama et al. | 257/306 |
| 5,170,233 | 12/1992 | Liu et al. | 257/308 |
| 5,240,871 | 8/1993 | Doan et al. | 438/397 |
| 5,330,928 | 7/1994 | Tseng | 438/254 |
| 5,362,664 | 11/1994 | Jun | 438/254 |
| 5,436,188 | 7/1995 | Chen | 438/254 |

FOREIGN PATENT DOCUMENTS

| 4-264767 | 9/1992 | Japan . |
| 5- 82750 | 4/1993 | Japan . |
| 6-181188 | 6/1994 | Japan . |

OTHER PUBLICATIONS

Patent Abstracts of Japan, vol. 17, No. 583 (E–1452) [22], Oct. 22, 1993 (corrs to JPA 5–175450).

Patent Abstracts of Japan, vol. 17, No. 504 (E–1430) Sep. 10, 1993 (corrs to JPA 5–129548).

*Primary Examiner*—Kristine L. Kincaid
*Assistant Examiner*—Anthony Dinkins
*Attorney, Agent, or Firm*—Sughrue, Mion, Zinn, Macpeak & Seas, PLLC

[57] ABSTRACT

In a semiconductor device, such as a memory cell, including a capacitor, a corrugated electrode is used as a lower electrode of the capacitor and is covered with an insulation film to be opposed to an upper electrode. The corrugated electrode is specified in section by a series of folded portions which are alternately folded vertically and horizontally. Practically, the corrugated electrode is formed by a corrugated wall which surrounds a hollow space and which has a rectangular or a polygonal shape on a plane. Alternatively, the corrugated wall has an irregular surface formed by an aggregation of grains so as to effectively widen a surface of the lower electrode. Such a corrugated electrode may be manufactured by a mold which is formed by selectively etching a stack of first-kind spacer films and second-kind spacer films.

18 Claims, 12 Drawing Sheets

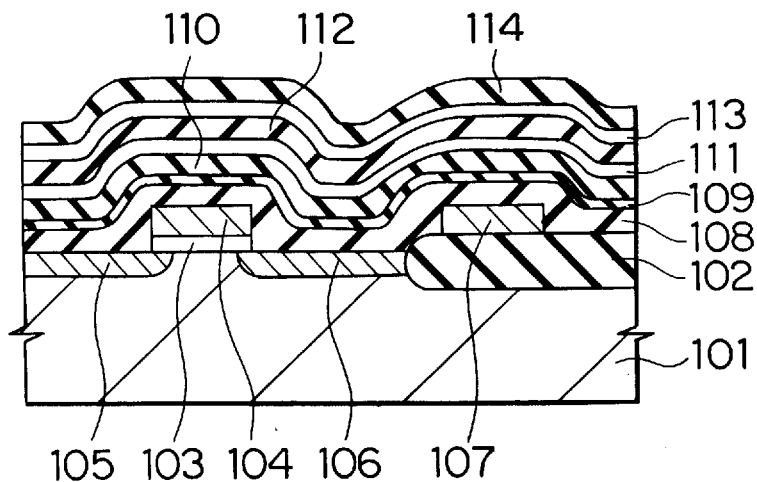
FIG. IA
PRIOR ART
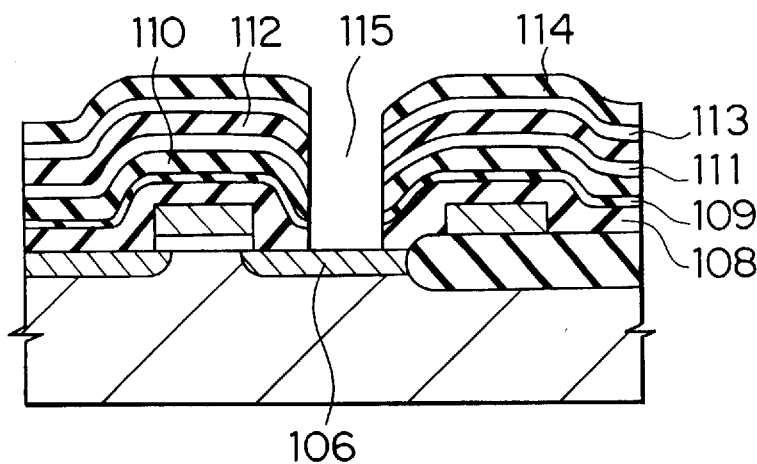
FIG. IB
PRIOR ART
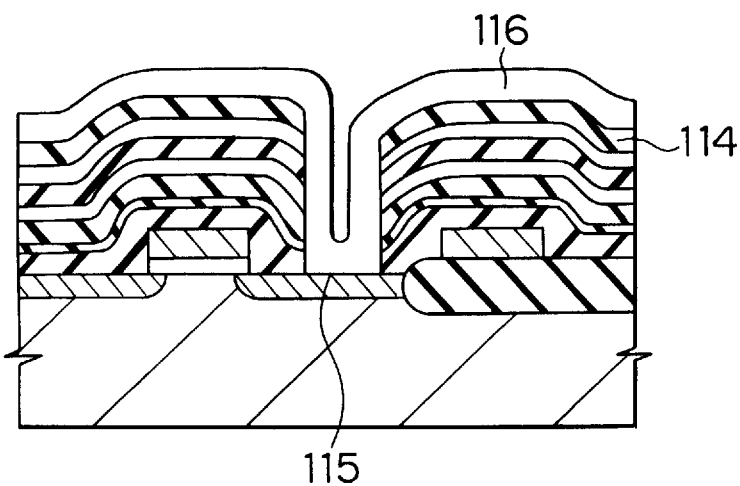
FIG. IC
PRIOR ART

STACKED CAPACITOR HAVING A CORRUGATED ELECTRODE

BACKGROUND OF THE INVENTION

This invention relates to a semiconductor device and a method of manufacturing the semiconductor device.

A wide variety of semiconductor devices have been used in an integrated circuit and a large scale integrated (LSI) circuit. Among others, a dynamic random access memory (will be abbrevitated to DRAM hereinafter) will be well known in the art as a read-write random access memory and has been specified by storage cells each of which is a combination of a single transfer transistor and a single capacitor. In this connection, each storage cell of the DRAM is simple in structure and is adequate for high integration of the semiconductor device.

In such a storage cell of the DRAM, recent development has been directed to a capacitor which has a three-dimensional structure, so as to integrate the DRAM at a more high density. This is because such a three dimensional structure of the capacitor enables a reduction of an area occupied by the capacitor and a fine structure of the capacitor. At any rate, such a capacitor of a three-dimensional structure may be called a three-dimensional capacitor and has a lower electrode, an upper electrode, and an insulator film interposed between the lower and the upper electrodes. The lower and the upper electrodes will be generalized as first and second electrodes, respectively, while the insulator will be called a capacitive insulator film, respectively. In addition, the lower or the first electrode will be often referred to as a storage electrode.

In the meanwhile, the three-dimensional capacitor should have capacitance greater than predetermined capacitance in order to insure stability in operation of the DRAM and reliability thereof. Under the circumstances, consideration has been made about widening a surface area of the lower or the first electrode included in the three-dimensional capacitor.

Herein, it is to be noted that the three-dimensional capacitor is classified into a capacitor of a trench type and a capacitor of a stacked type both of which will be simply referred to as a trench capacitor and a stacked capacitor, respectively. Although the trench capacitor and the stacked capacitor have merits and demerits, respectively, the staked capacitor excels the trench capacitor in a property of resistance against an alpha ray and a noise generated by other circuits and in stability of operation in small capacitance. Accordingly, it has been expected that the stacked capacitor is more effective than the trench capacitor in a DRAM of 1 Gb which requires a design standard of 0.15 micron meter or so.

As such a stacked capacitor, a lot of proposals have been recently made about a fin structure and a cylinder structure.

For example, the stacked capacitor of the fin structure has been disclosed in Japanese Unexamined Patent Publication No. Hei 5-82750, namely, 82,750/1993 which will be referred as a first reference. In the stacked capacitor disclosed, a lower or a first electrode is shaped into a fin structure which has a plurality of fins spaced apart from one another. The plurality of the fins are connected to a stem portion contacted with a semiconductor substrate and horizontally extended from the stem portion over the semiconductor substrate with gaps left therebetween. In other words, the illustrated lower electrode of the stacked capacitor looks in section like a tree which has a stem and a plurality of branches extended from the stem.

The stacked capacitor of the this type is disadvantageous in that the fins or branches become weak in mechanical strength and are sagged or deformed as each fin becomes thin in thickness.

On the other hand, a stacked capacitor of the cylinder structure has been proposed in Japanese Unexamined Patent Publication No. Hei 4-264,767, namely, 264767/1992 which may be named a second reference. In the stacked capacitor illustrated in the second reference, a lower electrode has a multi-cylindrical structure formed by a plurality of upright cylinders which concentrically stand up from a semiconductor substrate with gaps left between two adjacent ones of the upright cylinders. The multi-cylindrical structure looks like a plurality of walls concentrically which stand on the semiconductor substrate with gaps left between two adjacent ones of the walls.

In this event, it is preferable that each cylinder or wall is thin in thickness to achieve high integration and high capacitance. However, such a thin wall becomes weak in mechanical strength. Moreover, a new material which has a weak stress and a good step coverage characteristic should be developed to enable thin cylinders. Under the circumstances, restrictions are imposed also on an increase of capacitance by increasing the cylinders.

In the interim, a flat area of a single cell becomes narrow with an increase of a memory capacity of the DRAM. However, capacity of each capacitor should be kept substantially constant even on an increase of the memory capacity in order to prevent a soft error resulting from an irradiation of the alpha ray. Taking this into account, the stacked capacitor should become high when the fin structure of the first reference is adopted. However, a level difference becomes large between an array portion of the memory cell and a peripheral portion. This brings about degradation of resolution in a photolithography process and a breakage or shortening of wirings.

SUMMARY OF THE INVENTION

It is an object of this invention to provide a capacitor which has a stacked structure and which is strong in mechanical strength.

It is another object of this invention to provide a capacitor of the type described, which can be readily fabricated by thin films.

It is still another object of this invention to provide a semiconductor device which includes the capacitor mentioned above.

It is yet another object of this invention to provide a method which is capable of manufacturing the capacitor and the semiconductor device mentioned before.

According to an aspect of this invention, a capacitor comprises a first electrode, a second electrode opposite to said first electrode, and an insulator film interposed between the first and the second electrodes. The first electrode comprises, in section, a corrugated electrode which is specified by a series of folded portions. The corrugated electrode is defined by a corrugated wall of an electrical conductive material which includes the series of the folded portions and which surrounds a space therein.

According to another aspect of this invention, a semiconductor device is used as a memory cell which comprises a transistor and a capacitor which is electrically connected to the transistor and which comprises a first electrode connected to the transistor, a second electrode opposite to the first electrode, and an insulator film interposed between the first and the second electrodes. The first electrode of the capacitor comprises, in section, a corrugated electrode which is specified by a series of folded portions. On the other hand, the transistor comprises a first region diffused into a semiconductor substrate, a second region diffused into the semiconductor substrate with a channel region left in the semiconductor substrate between the first and the second regions, a gate insulation film on the channel region, a gate electrode deposited on the gate insulation film, a bit line electrically connected to the first region, a word line connected to the gate electrode, and an electrical conductor which electrically connects the second region of the transistor to the first electrode of the capacitor.

According to still another aspect of this invention, a method is for use in manufacturing a capacitor which comprises a first electrode, a second electrode opposite to the first electrode, and an insulator film interposed between the first and the second electrodes. The method comprises the steps of fabricating a mold having a side surface of a corrugated configuration, coating the side surface of the corrugated configuration with a conductive film which has a corrugated shape, and separating the mold from the conductive film to leave the conductive film of the corrugated shape and to form a corrugated electrode as the first electrode.

In this event, the mold fabricating step comprises the steps of selecting a first spacer material and a second spacer material which is different from the first spacer material, alternately stacking a first spacer film of the first spacer material and a second spacer film of the second spacer material to form a stack of the first and the second spacer films which has a center area and a peripheral area surrounding the center area and which includes a plurality of the first spacer films and the second spacer films, and removing the first spacer films from the peripheral area with the center area left unremoved together with the second spacer films to indent the stack into the side surface of the corrugated configuration and to prepare the mold. Alternatively, the mold fabricating step may comprise the steps of selecting a first spacer material and a second spacer material which is different from the first spacer material, alternately stacking a first spacer film of the first spacer material and a second spacer film of the second spacer material to form a stack of the first and the second spacer films which has a predetermined area and a peripheral area surrounding the predetermined area and which includes a plurality of the first spacer films and the second spacer films, perforating the predetermined area of the stack to make a contact hole through the stack, embedding, in the contact hole, a post of a post material identical with the second spacer material, and etching only the first spacer films from the peripheral area of the stack with the post and the second spacer films which are left unetched from the stack as the mold.

BRIEF DESCRIPTION OF THE DRAWING

FIGS. 1A through 1F show sectional views for use in describing a conventional method in the order of processes;

DESCRIPTION OF THE PREFERRED EMBODIMENTS

Figure 1D:
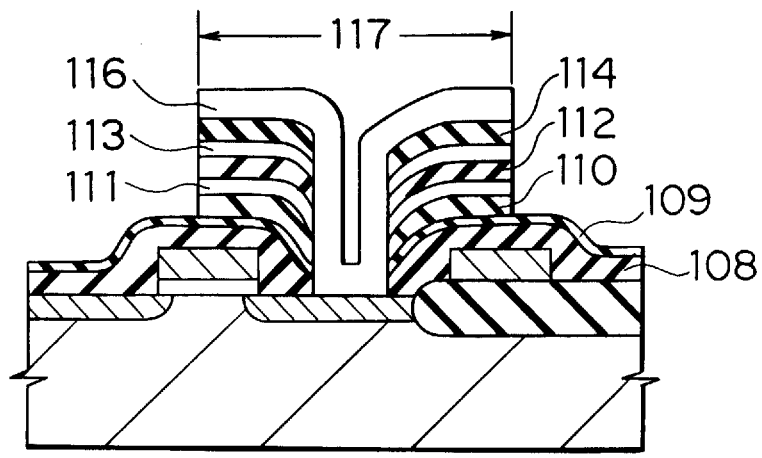

Referring to FIGS. 1A through 1F, a conventional semiconductor device will be described for a better understanding of this invention and is substantially equivalent to that illustrated in the first reference quoted in the preamble of the instant specification. In FIG. 1A, a semiconductor substrate 101 of a P type is prepared which has a principal surface directed upwards of FIG. 1A and a back surface directed downwards of FIG. 1A. The principal surface of the semiconductor substrate 101 is selectively oxidized to form field oxide films which are represented by a single field oxide film 102 in FIGS. 1A through 1F and which define element areas inside the field oxide films. In the illustrated example, each of the element areas serves to define a memory cell area represented by a single memory cell area in FIGS. 1A through 1F.

As shown in FIG. 1A, a gate oxide film 103 and a gate electrode 104 are successively formed within the memory cell area of the principal surface of the semiconductor substrate 101. In the memory cell area located on both sides of the gate oxide film 103, first and second diffusion layers, namely, regions 105 and 106 of an $N^+$ type are formed by diffusing an $N^+$ impurity into the semiconductor substrate 101. The first diffusion region 105 will be connected to a gate line to be described later while the second diffusion layer 106 serves as a storage node, as will be mentioned later. Thus, a transfer transistor is given by the first and the second diffusion regions 105 and 106, the gate oxide film 103, and the gate electrode 104. In addition, a gate electrode connection pattern 107 is located on the field oxide film 102 and is electrically connected to a gate electrode of another memory cell which is adjacent to the illustrated memory cell and which is not shown in FIGS. 1A through 1F.

Subsequently, an interlayer insulation film 108 is deposited on by a chemical vapor deposition (CVD) method, as shown in FIG. 1A. On the interlayer insulation film 108, an etching stopper film 109 which may be, for example, a silicon nitride film is also deposited on the interlayer insulation film 108 by the CVD method.

Thereafter, a first spacer film 110 of $SiO_2$, a first polysilicon film 111 doped with an impurity of the $N^+$ type, a second spacer film 112 of $SiO_2$, a second polysilicon film 113 doped with the impurity of the $N^+$ type, and a third spacer film 114 of $SiO_2$ are successively deposited on the etching stopper film 109. Herein, each of the first through the third spacer films 110, 112, and 114 has a thickness of 30 nm while each of the first and the second polysilicon films 111 and 113 has a thickness of 20 nm.

As illustrated in FIG. 1B, dry etching is carried out by the use of a reactive ion etching (RIE) technique to successively and selectively etch the third spacer film 114, the second polysilicon film 113, the second spacer film 112, the first polysilicon film 111, the first spacer film 110, the etching stopper film 109, and the interlayer insulation film 108. As a result, a contact hole 115 is opened on the second diffusion layer 106 to expose a surface of the second diffusion layer 106.

Thereafter, a third polysilicon film 116 is deposited on an internal surface of the contact hole 115 and the third spacer film 114, as shown in FIG. 1C. The illustrated third polysilicon film 116 is doped with the impurity of the $N^+$ type like the first and the second polysilicon films 111 and 113 and has a thickness of 50 nm or so.

Subsequently, a stack of the spacer films 110, 112, 114 and the polysilicon films 111 and 113 is patterned into a shape, as shown in FIG. 1D, by a photolithography technique and a dry etching technique. The illustrated shape will be called a storage electrode configuration hereinafter.

As readily understood from FIG. 1D, the interlayer insulation film 108 is not etched during the above-mentioned patterning. This means that the etching stopper film 109 serves to protect the interlayer insulation film 108 from being etched.

Next, the first, the second, and third spacer films 110, 112, and 114 are removed by wet etching which uses an etchant formed by a chemical solution including fluoric acid. During the wet etching, the etching stopper film 109 is not etched and also serves to protect the interlayer insulation film 108 from being etched by the etchant.

Figure 1E:
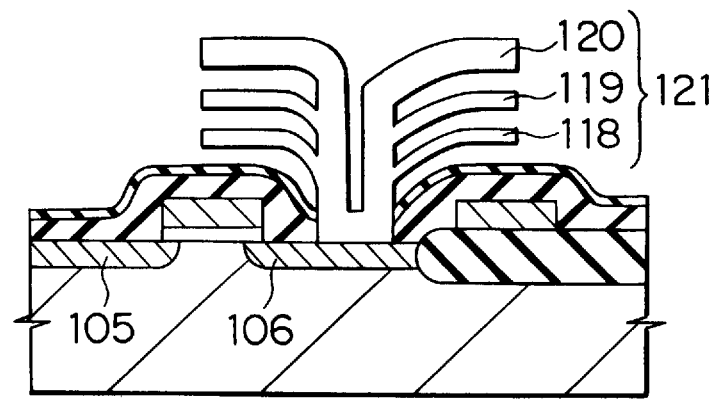

Consequently, only the first, the second, and the third polysilicon films 111, 113, and 116 are left on the etching stopper film 109 in the form illustrated in FIG. 1E and are collectively operable as a lower electrode of a capacitor, namely, a storage electrode of the capacitor, as will be described later in detail. As shown in FIG. 1E, the storage electrode has a tree-like structure which has a stem perpendicular to the surface of the second diffusion layer 106 and first, second, and third branches 118, 119, and 120 laterally extended from the stem. Such a tree-like structure may be said to be a fin structure which has first through third fins 118 to 120.

As mentioned before, the third fin 120 and the stem are thicker in thickness than the first and the second fins 118 and 119 so as to mechanically support the first and the second fins 118 and 119. Thus, the storage electrode of a triple fin structure 121 is obtained which has the first through the third fins or branches 118 to 120. Herein, it is to be noted that the fins or branches 118 to 120 are joined to the stem which supports the fins 118 to 120.

Figure 1F:
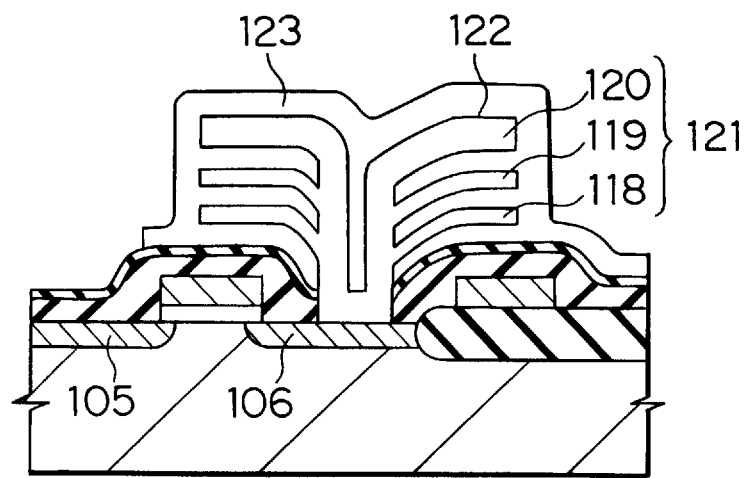

Thereafter, an insulator film 122 which is depicted at a thick line in FIG. 1F and which may be referred to as a capacitor insulator film is deposited on a whole surface of the storage electrode of the triple fin structure 121, as illustrated in FIG. 1F. Subsequently, a polysilicon film which is doped with an impurity of an $N^+$ type is formed on the storage electrode and is shaped by dry etching carried out by the use of the reactive ion etching (RIE) technique into an upper electrode 123 of the capacitor. The upper electrode 123 may be called a plate electrode.

Thus, the memory cell is manufactured as a semiconductor device which is composed of the single transfer transistor and the single capacitor. In the following process, a bit line is formed on the first diffusion layer 105 to be contacted therewith and is laid on the plate electrode 123 through the interlayer insulation film 108.

The semiconductor device illustrated in FIGS. 1A through 1F has disadvantages as pointed out by the preamble of the instant specification.

Figure 2:
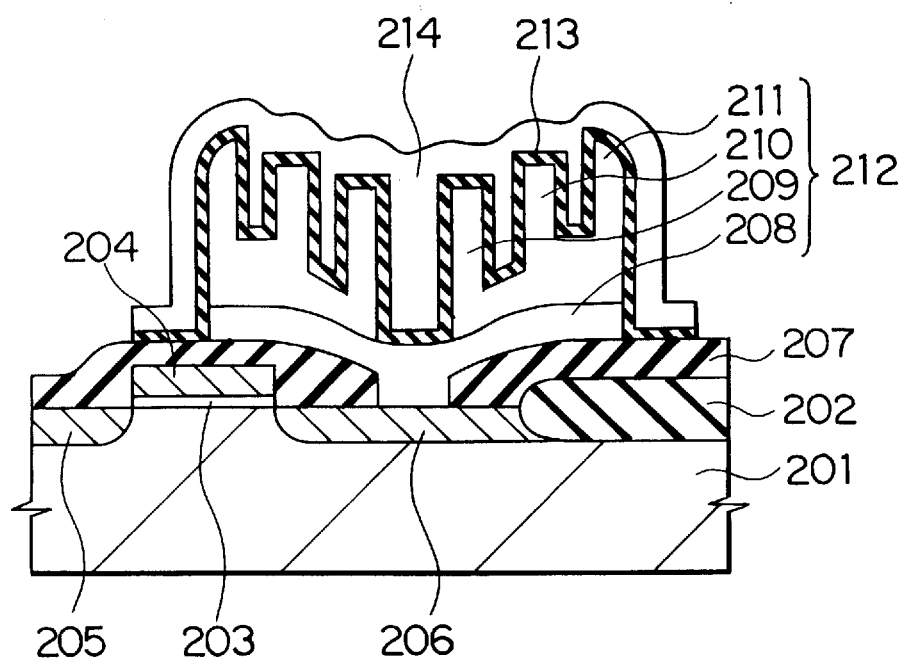
FIG. 2 shows a sectional view for use in describing another conventional method.

Referring to FIG. 2, description will be made about another conventional semiconductor device that is substantially equivalent to that described in the second reference quoted in the preamble of the instant specification. The illustrated conventional semiconductor device is also specified by a combination of a transfer transistor and a capacitor.

As shown in FIG. 2, a silicon substrate 201 of a P type is prepared which has a principal surface directed upwards and a back surface directed downwards. On the principal surface, field oxide films which are represented by a single field oxide film 202 are formed to define element areas, namely, memory cell areas. Thereafter, a gate oxide film 203 and a gate electrode 204 are successively formed within each memory cell area. Next, diffusion is carried out to form first and second diffusion layers 205 and 206 of the $N^+$ type on both sides of the gate oxide film 203 and the gate electrode 204. Thus, production is made of the transfer transistor which comprises the first and the second diffusion layers 205 and 206, the gate oxide film 203, and the gate electrode 204.

The field oxide film 202 and the transfer transistor are covered with an interlayer insulation film 207. The interlayer insulation film 207 is selectively opened to form a contact hole on the second diffusion layer 206 which serves as a storage node.

Subsequently, the capacitor is formed on the second diffusion layer 206. Specifically, an underlying electrode 208 which serves as a part of a lower electrode of the capacitor is formed on the second diffusion layer 206 and is brought into electrical contact with the second diffusion layer 206. On the underlying electrode 208, a plurality of cylindrical electrodes are formed as a storage electrode. In the illustrated example, first, second, and third ones of the cylindrical electrodes 209, 210, and 211 are concentrically arranged on the underlying electrode 208 and are electrically connected to the underlying electrode 208. The first cylindrical electrode 209 is smaller in diameter than the second cylindrical electrode 210 while the second cylindrical electrode 210 is smaller in diameter than the third cylindrical electrode 211. In other words, the diameters of the first through the third cylindrical electrodes 209 to 211 gradually become large in the order of the first through the third cylindrical electrodes 209 to 211. Thus, a lower electrode 212 of the capacitor which has a triple cylindrical structure is manufactured as a storage electrode.

After formation of the storage electrode, an insulator film 213 is covered on a whole surface of the storage electrode 212. On the insulator film 213, an upper electrode 214 is deposited as a plate electrode to complete the capacitor. Thus, the semiconductor device which is composed of the single transfer transistor and the single capacitor is manufactured within the memory cell area.

With this structure, each of the first through the third cylindrical electrodes 209, 210, and 211 are vertically extended relative to the principal surface of the semiconductor substrate 201, as illustrated in FIG. 2 and stand from the underlying film 208 like walls which have heights between bottom portions and top portions thereof. In other words, each wall or cylindrical electrode has a deep level difference between the bottom and the top portions of each wall.

Herein, it is to be noted that the insulator film 213 and the plate electrode 214 should completely cover a whole surface of the walls. However, it is very difficult to completely cover the whole surface of the walls with the plate electrode 214 because each of the walls is very high, as long as a known material is used to form the plate electrode 214. Therefore, the capacitor illustrated in FIG. 2 has shortcomings as mentioned in the preamble of the instant specification.

Figure 3A:
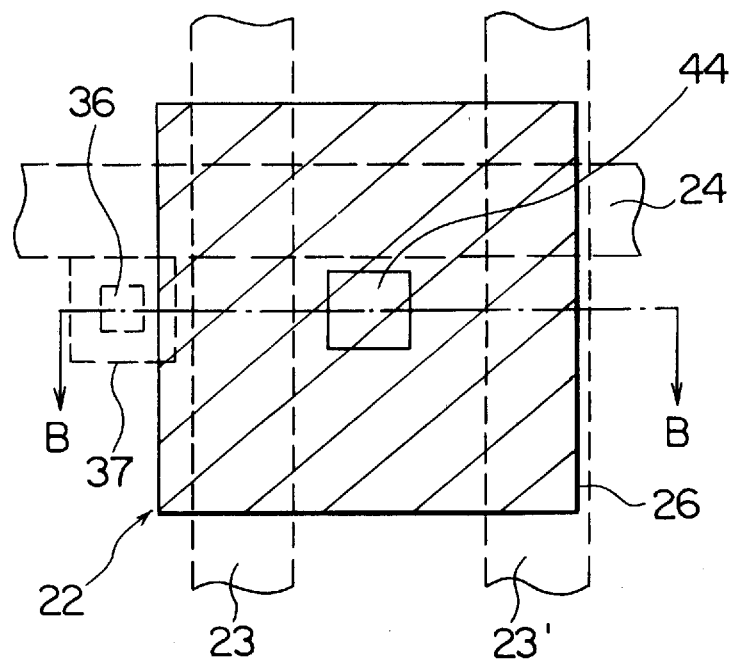
FIG. 3A is a plan view of a semiconductor device according to a first embodiment of this invention.
Figure 3B:
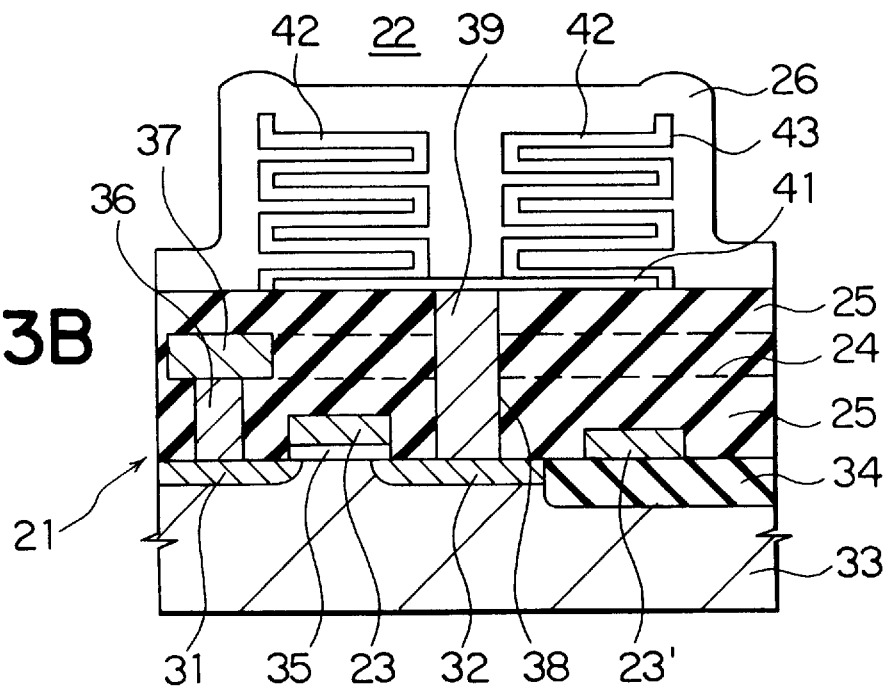
FIG. 3B is a sectional view of the semiconductor device taken along a line B—B in FIG. 3A.

Referring to FIGS. 3A and 3B, a semiconductor device according to a first embodiment of this invention includes a transfer transistor 21 and a capacitor 22 both of which are operable as a memory cell in a dynamic random access memory (DRAM). In this event, it is assumed that the transfer transistor 21 is connected to a word line 23 and a bit line 24 while the capacitor 22 is electrically connected to the transfer transistor 21 and that each word line 23 underlies each bit line 24. In addition, the bit and the word lines 24 and 23 are buried within an interlayer insulation film 25 (FIG. 1B).

In FIG. 3A, another word line 23' is also illustrated and is connected to an adjacent transfer transistor (not shown). For brevity of illustration, FIG. 3A shows only a portion located above the word lines 23 together with the capacitor 22 which is specified in FIG. 3A by an upper or a plate electrode 26 (hatched in FIG. 3A). On the other hand, FIG. 3B shows a sectional view taken along a line B—B in FIG. 3A. As illustrated in FIG. 3B, the interlayer insulation film 25 provides a reference surface and the capacitor 22 is stacked on the reference surface given by the interlayer insulation film 25. The bit and the word lines 24 and 23 underlies the reference surface, as readily understood from FIG. 3B.

In FIG. 3B, the transfer transistor 21 has first and second diffusion layers 31 and 32 of an $N^+$ type diffused into a memory cell area of a semiconductor substrate 33 of a P type, a gate oxide film 35, and a gate electrode which forms a part of the word line 23. The memory cell area is defined by a field oxide film 34 and the first and the second diffusion layers 31 and 32 are formed within the memory cell area. The transfer transistor 21 itself may be manufactured in the same manner as that illustrated in FIGS. 1A through 1F and 2.

Herein, it is to be noted in FIGS. 3A and 3B that the first diffusion layer 31 is electrically connected to the bit line 24 through a contact plug 36 and a bit line pad 37 of tungsten. To this end, the interlayer insulation film 25 is selectively perforated on the first diffusion layer 31 to form a contact hole and the contact plug 36 is filled up within the contact hole and is connected to the bit line pad 37 connected to the bit line 24. As shown in FIG. 3B, the bit line 24 is covered with the interlayer insulation film 25 to be buried therein. Thus, the interlayer insulation film 25 is finally formed to cover both the word and the bit lines 23, 23', and 24 and provides the reference surface for assembling the capacitor 22.

Moreover, a contact hole 38 is opened throughout the interlayer insulation film 25 and reaches the second diffusion layer 32. A contact plug 39 for the capacitor 22 is filled up within the contact hole 38 and is extended to the reference surface of the interlayer insulation film 25. The contact plug 39 is formed by a conductive material.

Thus, the first diffusion layer 31 is electrically connected to the bit line 24, as mentioned before, and may be called a bit line layer while the second diffusion layer 32 is electrically connected to the capacitor 22 and may be referred to as a storage layer.

On the interlayer insulation film 25 providing the reference surface, the capacitor 22 is stacked in the manner illustrated in FIG. 3B. More specifically, the capacitor 22 has a lower electrode, an upper electrode, and an insulator film interposed between the lower and the upper electrodes. The lower and the upper electrodes may be called first and second electrodes, respectively. In the example illustrated in FIG. 3B, the lower electrode of the capacitor 22 includes an underlying layer 41 laid on the reference surface of the interlayer insulation film 25 and electrically connected to the contact plug 39. Moreover, the lower electrode further includes an extended portion 42 which has, in cross-section, a bellows-like or a corrugated configuration attached to the underlying layer 41 and which is extended away from the reference surface, as readily understood from FIG. 3B. The extended portion 42 of the corrugated configuration or shape has a rectangular shape on a plan view, as shown in FIG. 3A and surrounds a rectangular hollow space 44 (FIG. 3A) formed at a center of the extended portion and has an internal side adjacent to the rectangular hollow space and an external side remote from the rectangular hollow space.

The corrugated configuration can be manufactured through a method which will be later described in detail and is specified by a series of folds or ridges which alternately appear on the internal side and the external side. In other words, the corrugated configuration may be defined by a continuous meandering path which has a plurality of visor-like plates laterally extended between the internal side and the external side with gaps left between two adjacent ones of the visor-like plates and a plurality of folds or ridges connected to two adjacent ones of the visor-like plates and extended substantially perpendicular to the reference surface, as shown in FIG. 3B. Thus, the-visor-like plates are vertically stacked to be superposed on one another with a space interval left between two adjacent ones of the visor-like plates and are supported by the ridges which are alternately located on the internal and the external sides. In this connection, the extended portion 42 illustrated in FIG. 3B will be referred to as a corrugated or a meandering portion.

The illustrated corrugated portion 42 may be formed by a conductive material, such as polysilicon doped with an impurity of an $N^+$ type and may have a thickness of 10 nm.

In FIG. 3B, a capacitor insulator film 43 is coated on a whole surface of the corrugated portion 42 and on a center portion of the underlying film 41. In addition, the plate electrode 26 of the capacitor 22 is formed as an upper or a second electrode on the capacitor insulator film 43. As a result, the underlying film 41 and the corrugated portion 42 are covered with the plated electrode 26 and, as a result, buried therein. Anyway, the capacitor 22 which is electrically connected to the transfer transistor 21 is manufactured in the above-mentioned manner. Thus, a memory cell of the DRAM is obtained which is formed by a combination of the single transfer transistor 21 and the single capacitor 22.

Referring to FIGS. 4A through 4F, description will be made about a method of manufacturing the semiconductor device illustrated in FIGS. 3A and 3B. Herein, it is assumed that the semiconductor device illustrated in FIGS. 4A through 4F is used as a memory cell of 1GDRAM. The method will be described in the order of processes or steps shown in FIGS. 4A to 4F. In FIGS. 4A through 4F, similar parts and portions are designated by like reference numerals.

Figure 4A:
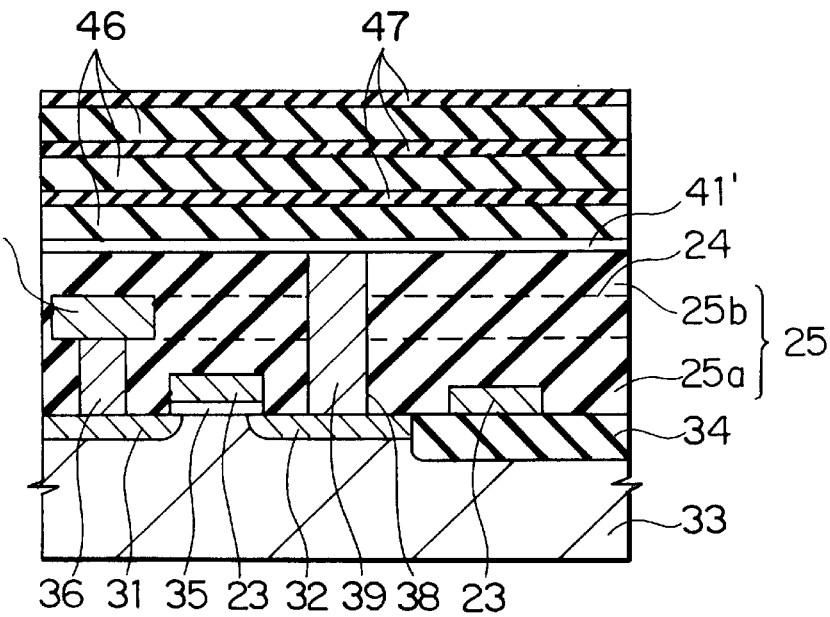
FIGS. 4A through 4F show sectional views for use in describing a method of manufacturing the semiconductor device illustrated in FIGS. 3A and B step by step.

In FIG. 4A, provision is at first made about the semiconductor substrate 33 of the P type which has a principal surface directed upwards of FIG. 4A and a back surface opposite to the principal surface. The semiconductor substrate 33 is selectively or locally oxidized to form the field oxide film 34. Such a field oxide film 34 may be formed by the use of a trench element isolation method or a method of recess local oxidation of silicon (LOCOS), both of which are known in the art. An element area or a memory cell area is defined on the principal surface of the semiconductor substrate 33 within the field oxide film. In the memory cell area, an MOS transistor is formed as a transfer transistor and includes the first and the second diffusion regions 31 and 32, the gate oxide film 35, and the gate electrode 23 which serves as a part of the word line. The first and the second diffusion regions 31 and 32 may be called a bit line diffusion layer and a capacitor diffusion layer because they are connected to the bit line 24 and the capacitor 22, respectively.

Simultaneously with formation of the gate electrode or the word line 23, another word line 23' is formed on the field oxide film 34 and is connected to an adjacent memory cell.

In the illustrated example, the gate oxide film 35 may be, for example, a silicon oxide film which has a thickness of 6 nm while the gate electrode or word line 23, 23' may be, for example, a titanium silicide/polysilicon multiple layer which has a thickness of 100 nm and which may be called a titanium polycide layer. In addition, the first and the second diffusion layers 31 and 32 has a depth of about 0.1 micronmeter and are formed by diffusion layers of the $N^+$ type.

Under the circumstances, a first partial interlayer insulation film 25a which may be of silicon oxide is deposited to a thickness of 500 nm or so by chemical vapor deposition (CVD) and is flattened into a flattened surface by chemical and mechanical polishing (CMP).

Thereafter, the first partial interlayer insulation film 25a is opened or perforated on the first diffusion layer 31 to form a contact hole which is filled up with a conductive material, such as tungsten, titanium nitride, tungsten silicide, to form the bit line plug 36 electrically connected to the first diffusion layer 31.

On the first partial interlayer insulation film 25a, a tungsten thin film is deposited to a thickness of 300 nm thick by the CVD and is finely patterned by a photolithography technique and a dry etching technique to form the bit line 24 and the bit line pad 37. As shown in FIG. 3A, the bit line pad 37 is electrically connected to the bit line 24.

Subsequently, a second partial interlayer insulation film 25b is deposited to a thickness of 400 nm in a manner similar to the first partial interlayer insulation film 25a so as to cover the bit line 24 and the bit line pad 37. Thus, the interlayer insulation film 25 is formed by a combination of the first and the second partial interlayer insulation films 25a and 25b.

Thereafter, the interlayer insulation film 25 is perforated on the second diffusion layer 32 by the use of a fine patterning technique to form a capacitor contact hole 38. A polysilicon layer is deposited by a low pressure CVD method which uses a mixture of a phosphine ($PH_3$) gas and either a silane($SiH_4$) gas or a disilane ($Si_2H_6$) gas. The illustrated polysilicon layer includes, as an impurity, phosphor of a concentration of $1.5 \times 10^{19}$ atom/$cm^3$ and is polished by the CMP method to form the capacitor contact plug 39. The concentration of phosphor may be changed to $1.5 \times 10^{20}$ atom/$cm^3$.

Next, a polysilicon film which includes phosphor as an impurity is deposited to a thickness of about 20 nm in a manner similar to the capacitor contact plug 39 and serves as the underlying film 41 when the polysilicon film is patterned. In this connection, the polysilicon film is depicted at 41' and may be called an unpatterned underlying film hereinuder.

Subsequently, three spacer films 46 of a first kind and three spacer films 47 of a second kind are alternately superposed on the underlying film 41 by a normal pressure CVD method in the manner illustrated in FIG. 4A. Herein, it is noted that each of the first-kind spacer films 46 is formed by a phosphosilicate glass (PSG) film which includes about 5 mol % of phosphor and has a thickness of about 70 nm while each of the second-kind spacer films 47 is formed by a silicon oxide film and has a thickness of about 20 nm.

Figure 4B:
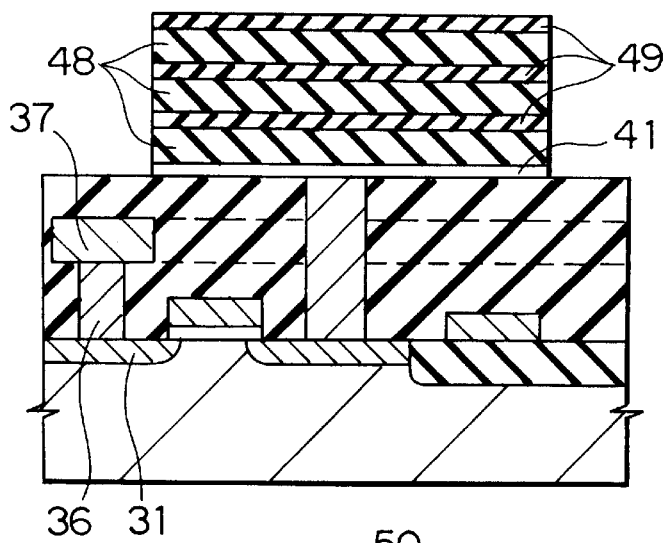

In FIG. 4B, the first-kind and the second-kind spacer films 46 and 47 and the unpatterned underlying film 41' are patterned by the use of a photolithography technique and a dry etching technique into first-kind and second-kind patterned spacer films 48 and 49 and the underlying film 41. Each of the first-kind and the second-kind patterned spacer films 48 and 49 and the underlying film 41 has a size of 0.5 micron meter square.

Figure 4C:
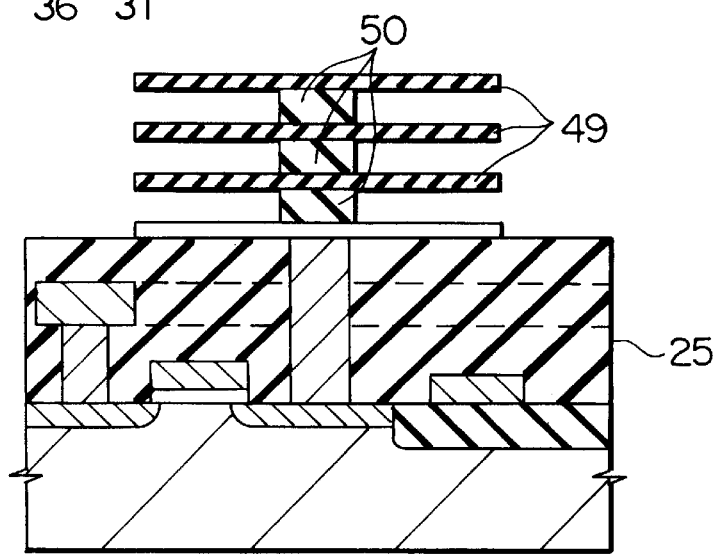

In this situation, the first-kind patterned spacer films 48 alone are subjected to etching with the second-kind patterned spacer films 49 unetched so that insulation posts 50 are left at center regions of the first-kind patterned spacer films 48 that are located on the capacitor contact plug 39, as shown in FIG. 4C. Briefly, such selective etching is carried out by the use of a method of selective processing which uses an HF vapor and which is disclosed in Japanese Unexamined Patent Publication No. Hei 6 -181188, namely, 181188/1994. The method will be referred to as a selective vapor HF etching.

Specifically, an etching chamber is at first filled as a reactive gas with a mixture of an HF gas of 600 Pa and a vapor not higher than 1 Pa. Under the circumstances, the first-kind patterned spacer films 48 are etched at a room temperature for a predetermined time.

Under these conditions, it has been found out that each of the first-kind patterned spacer films 48 is etched at a first etching rate of 1000 nm/min while each of the second-kind patterned spacer films 49 is etched at a second etching rate of 1.5 nm/min. Taking this into consideration, the predetermined time may be selected at a time between 8 and 10 seconds. As a result, each of the insulation posts 50 has a diameter of about 0.1 micron meter. On the other hand, each of the second-kind patterned spacer films 49 is etched subtly by 0.4 nm on both surfaces thereof and becomes thin only by one-twentieth of the total thickness of 20 nm. This shows that a serious problem never takes place in the thickness of each of the second-kind patterned spacer films 49.

Figure 4D:
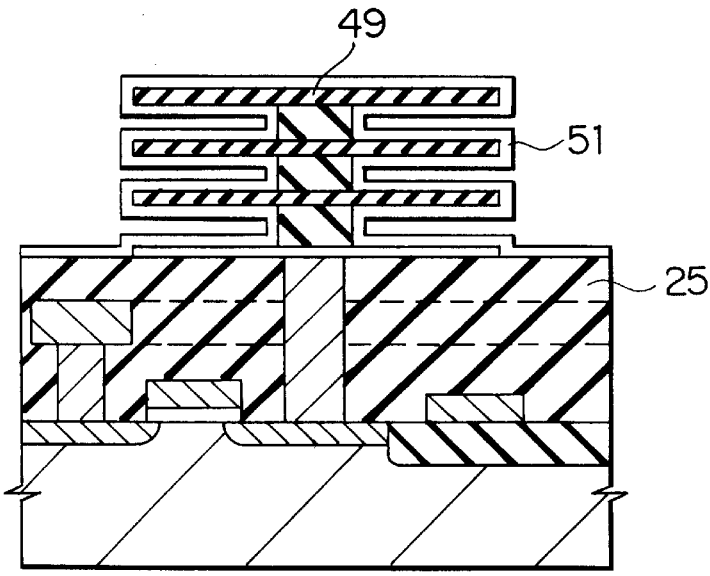

As shown in FIG. 4D, a corrugated shaped electrode film 51 is formed on a whole surface of the second-kind patterned spacer films 40 and the insulation posts 50 and has a thickness of 20 nm. The corrugated shaped electrode film 51 is composed of a polysilicon film which is deposited by a low pressure CVD method and which is doped with a phosphor impurity of $1 \times 10^{19}$–$1 \times 10^{20}$ atom/$cm^3$.

Subsequently, anisotropic dry etching is conducted to anisotropically or partially etch the polysilicon film and to remove, from the corrugated shaped electrode film 51, an outermost portion of the polysilicon film and a portion laid on the interlayer insulation film 25.

Figure 4E:
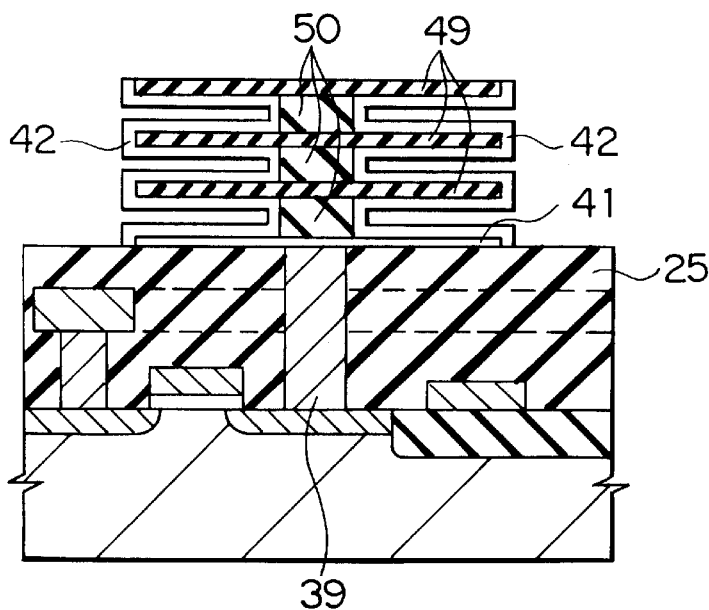

As a result, the corrugated electrode 42 is left on the interlayer insulation film 25, the insulation posts 50, and the second-kind patterned spacer films 49, as illustrated in FIG. 4E. As readily understood form FIG. 4E, the corrugated electrode 42 is electrically connected to the capacity contact plug 39 through the underlying film 41. In this connection, the combination of the underlying film 41 and the corrugated electrode 42 serves as the lower or the first electrode of the capacitor.

Figure 4F:
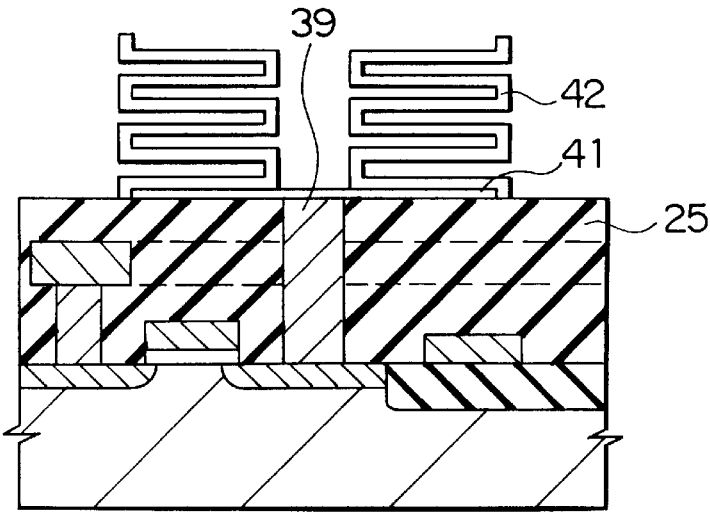

Under the circumstances, the second-kind patterned spacer films 49 and the insulation posts 50 are removed by wet etching which is conducted within a chemical etchant, such as fluoric acid. In consequence, only the corrugated electrode 42 is left on the underlying film 41, as shown in FIG. 4F. Thus, the manufactured corrugated electrode 42 has a size of 0.5 micron meter square and a height of 0.3 micron meter.

During removal of the second-kind patterned spacer films 49 and the insulation posts 50, the interlayer insultation film 25 is also somewhat etched by the wet etching by 0.1 micron meter. Such an etched amount of the interlayer insulation film 25 never brings about a serious problem.

In order to avoid such etching of an interlayer insulation film 25, a silicon nitride film or a silicon oxide film including an excessive amount of silicon atoms may be covered as a mask insulation film on the interlayer insulation film 25.

As mentioned above, the illustrated corrugated electrode 42 is manufactured by using the second-kind patterned spacer films 49 and the insulation posts 40 as a mold which is formed by the selective vapor HF etching which is excellent in etching selectivity. Therefore,the first or the lower electrode has a precise configuration and serves as a storage electrode.

In the following process, a very thin silicon nitride film is deposited as the insulator film 43 to a thickness of about 5 nm on the underlying film 41 and the corrugated electrode 42 and, thereafter, a polysilicon film is deposited on the silicon nitride film to form the plate or the second electrode 26 of the capacitor, as illustrated in FIG. 3. Thus, the memory cell is completed which comprises the single transfer transistor and the single capacitor.

Practically, the plate or the second electrode 26 should be deposited on gaps left between the corrugated electrode 42. To this end, the actual design is made so that each thickness of the first-kind patterned spacer films 48 becomes thicker than twice a sum of the thicknesses of the corrugated electrode 42 and the insulator film 43.

Figure 5A:
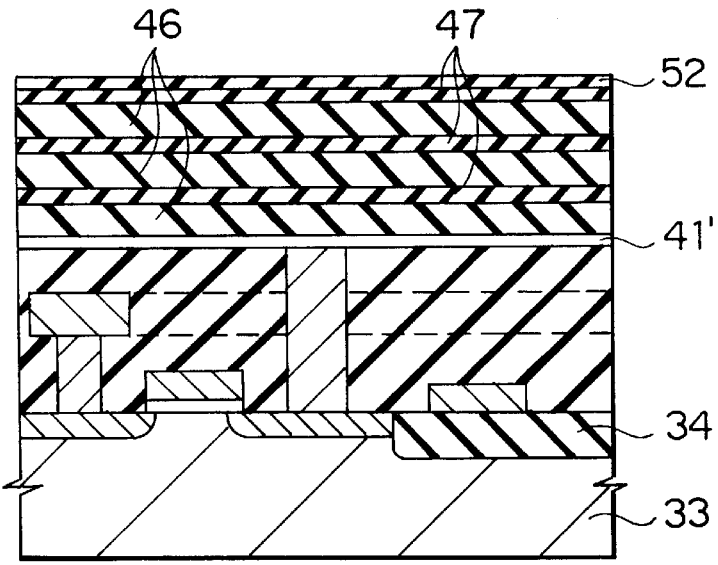
FIGS. 5A through 5C show sectional views for use in describing another method of manufacturing the semiconductor device illustrated in FIGS. 3A and B.
Figure 5B:
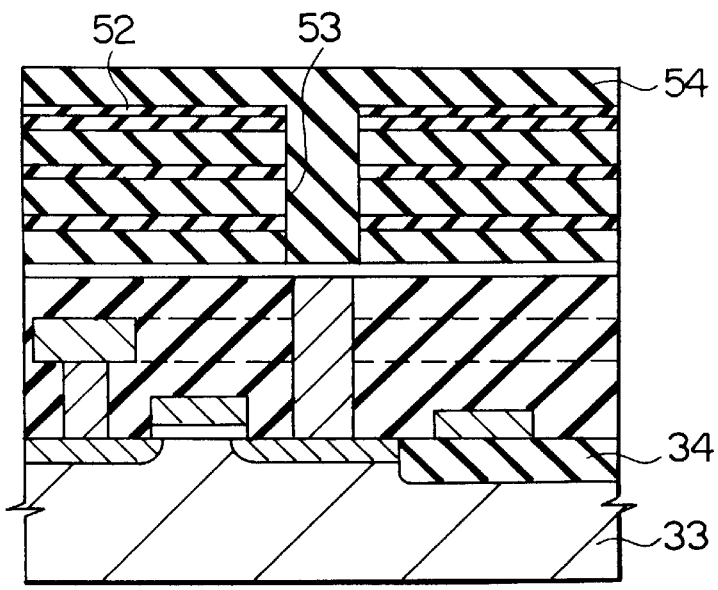
Figure 5C:
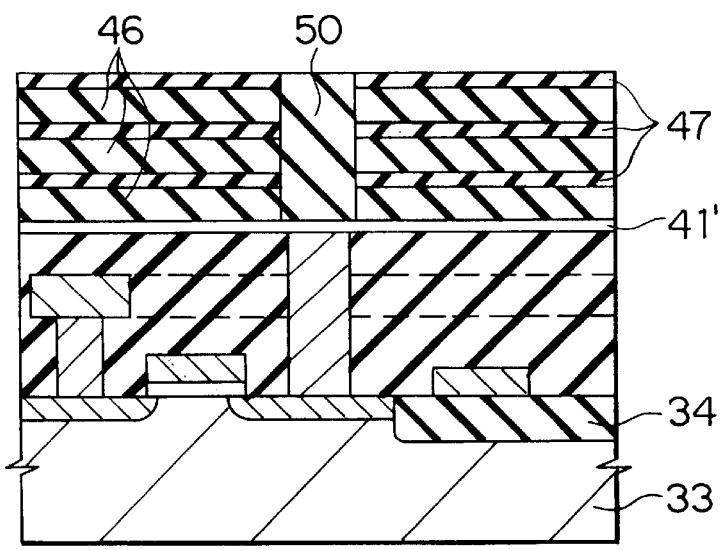

Referring to FIGS. 5A through 5C, description will be made about another method of manufacturing the memory cell illustrated in FIG. 3B. The method illustrated in FIG. 5A through 5C is different from that illustrated in FIGS. 4A through 4F in the way of manufacturing an insulation post depicted at 50 in FIG. 5A through 5C also and will be therefore mainly described about a series of processes carried out until formation of the insulation post 50. As readily understood from FIG. 5A, processes are similar to those illustrated in FIG. 5A through 5C before the unpatterned underlying film 41' is formed. Accordingly, description will be omitted until formation of the unpatterned underlying film 41'.

On the unpatterned underlying film 41', a stack of spacer films is deposited on the unpatterned underlying film 41' by a normal pressure CVD method. Specifically, three spacer films of a first kind 46 and three spacer films of a second kind 47 are alternately deposited in a manner similar to that illustrated in FIGS. 4A through 4F and will be called first-kind spacer films, respectively, like in FIGS. 4A through 4F. In this event, the first-kind spacer films 46 are formed by BPSG (borophosphosilicate glass) films which are silicon oxide films including boron glass and phosphor glass. In the example illustrated, each of the first-kind spacer films 46 includes about 5 mol % of phosphor and about 10 mol % of boron and has a thickness of 70 nm. On the other hand, each of the second-kind spacer films 47 is formed by a silicon oxide film and has a thickness of about 20 nm.

As shown in FIG. 5A, a protection insulation film 52 of, for example, silicon nitride is deposited on an uppermost one of the first-kind spacer films to a thickness of about 10 nm.

In FIG. 5B, the protection insulation film 52, the second-kind spacer films 47, and the first-kind spacer films 46 are selectively removed by the dry etching to form a post hole 53 through the protection insulation film 52, the second-kind spacer films 47, and the first-kind spacer films 46. The post hole 53 has a diameter of 0.1 micron meter and a depth of 150 nm.

Subsequently, a filling or an embedding insulator 54 of silicon oxide is embedded into the post hole 53 and on the protection insulation film 52 by the CVD method to a thickness of about 150 nm. In this case, the deposition of the embedding insulator 54 is carried out at a temperature of 400° C. by using, as a reactive gas, a mixed gas of a tetraethoxysilane (TEOS) gas and oxygen. It has been found out that such a mixed gas is useful to establish excellent step coverage.

The filling insulator 54 is polished by the CMP method to the protection insulation film 52 which serves as an etching stopper film. Thus, the insulation post 50 is buried within the first-kind and the second-kind spacer films 46 and 47, as shown in FIG. 5C. In the illustrated example, it is to be noted that the insulation post 50 is formed by a material identical with that of the second-kind spacer films 47, although the insulation posts 50 illustrated in FIG. 4C are formed by a material which is the same as the first-kind spacer films 46.

Under the circumstances, the first-kind spacer films 46, the second-kind spacer films 47, and the underlying unpatterned film 41 are patterned into the first-kind patterned spacer films 48, the second-kind patterned spacer films 49, and the underlying film 41, respectively, like in FIG. 4B. Thereafter, the selective vapor HF etching is carried out to remove only the first-kind patterned spacer films 48. As a result, the second-kind patterned spacer films 49 and the insulation post 50 are left on the underlying film 41, like in FIG. 4C.

According to this method, the selective HF processing can be readily controlled to remove the first-kind patterned spacer films 48 in comparison with the method mentioned in conjunction with FIG. 4C. In this event, a processing chamber is filled with a mixed gas which mixes an HF gas of 600 Pa with a water vapor not higher than 1 Pa and only the first-kind patterned spacer films 48 are etched under a room temperature. Under the conditions, the first-kind patterned spacer films 48 are etched at a first etching rate of 2000 nm/min while the second-kind patterned spacer films 49 and the insulation post 50 are etched at a second etching rate of 1.5 nm/min. The first etching rate is considerably greater than the second etching rate. This means that it is possible to maintain a sufficient process margin during the selective vapor HF etching.

With this structure, the insulation post 50 is formed by the material which is very low in the etching rate against the HF gas and which is not substantially etched in this method. This shows that the insulation post 50 may not be always located at a center area of each of the second-kind patterned spacer films 49, differing from the insulation posts illustrated in FIG. 4C.

Figure 6:
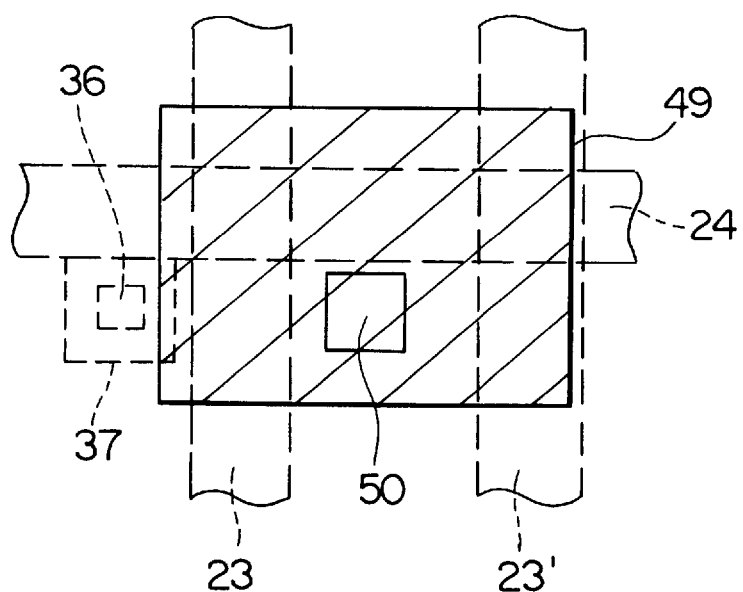
FIG. 6 shows a modification of the semiconductor device which is capable of being manufactured by the method illustrated in FIGS. 5A through 5C.

Referring to FIG. 6, the insulation post 50 is located at a portion adjacent to a lower edge of the second-kind patterned spacer films 49. Accordingly, it is possible with this method to form the corrugated electrode 42 which has an optional configuration on a plane in consideration of a size of a memory cell.

Referring to FIGS. 7A through 7F, description will be directed to a method according to this invention. The method will be named a third method hereinunder and comprises the steps which are identical with those illustrated in FIG. 4 until deposition of the interlayer insulation film 25, namely, the second partial interlayer insulation film 25b and which will not be described any longer.

Figure 7A:
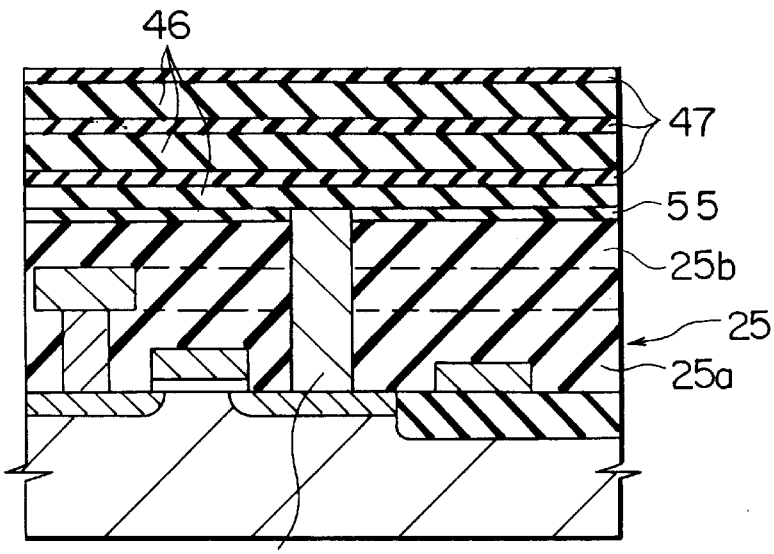
FIGS. 7A through 7F show sectional views for use in describing still another method illustrated in FIGS. 3A and 3B.

In FIG. 7A, a mask insulation film 55 which may be a silicon nitride film is deposited to a thickness of about 20 nm by a CVD method. Subsequently, a stack of spacer films are deposited on the mask insulation film 55 by a normal pressure CVD method. More specifically, three films of a first kind 46 and three films of a second kind 47 are alternately deposited on the mask insulation film 55 and will be called first-kind and second-kind spacer films 46 and 47, respectively. Practically, the first-kind spacer films 46 are formed by phosphosilicate glass (PSG) films and include, as an impurity, about 5 mol % of phosphor while the second-kind spacer films 47 are formed by silicon oxide films and have a thickness of 20 nm. In addition, a lowest one of the first-kind spacer films 46 has a thickness of 40 nm while the remaining first-kind spacer films 46 have a thickness of about 70 nm.

Figure 7B:
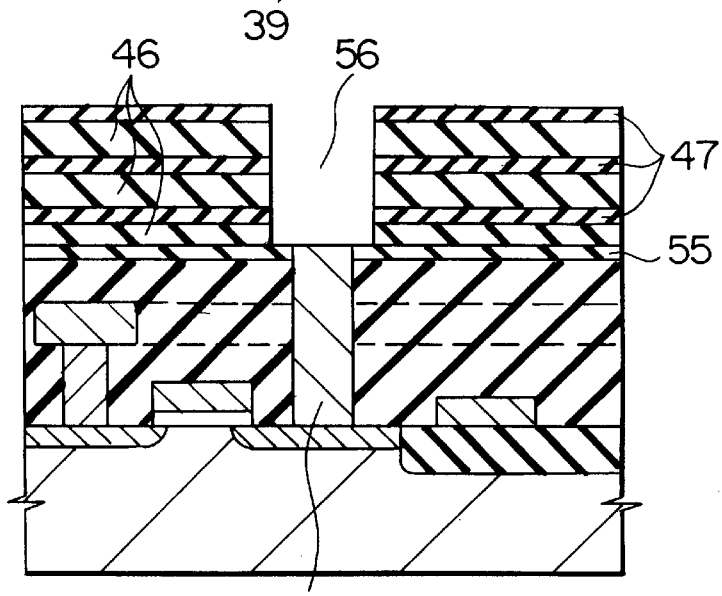

In FIG. 7B, the first-kind and the second-kind spacer films 46 and 47 are selectively removed by the dry etching at a portion located above the capacitor cantact plug 39. Thus, a spacer etching hole 56 is formed which exposes the surface of the capacitor contact plug 39 and a part of the mask insulation film 55.

Figure 7C:
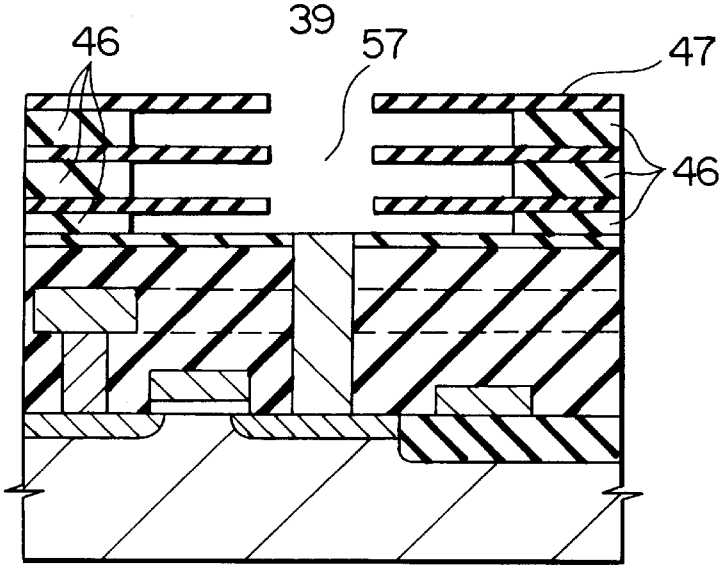

As shown in FIG. 7C, the first-kind spacer films 46 alone are laterally and selectively etched to a predetermined position to form an internal space 57 within the first-kind spacer films 46. Such selective etchin is carried out by the use of the selective HF processing technique mentioned in conjunction with FIGS. 4 and 5. The internal space is defined by side walls of the first-kind and the second-kind spacer films 46 and 47 exposed to the internal space 57. Specifically, a mixed gas of the HG gas of 600 Pa and the water vapor not higher than 1 Pa is introduced as a reactive gas into an etching chamber to etch the first-kind spacer films 46 for a predetermined time at the room temperature.

Under the conditions, the first-kind spacer films 46 are etched at a first etching rate of 1000 nm/min while the second-kind spacer films 47 are etched at a second etching rate of 1.5 nm/min. In consequence, only the first-kind spacer films 46 are substantially etched with the second-kind spacer films 47 substantially unetched.

Figure 7D:
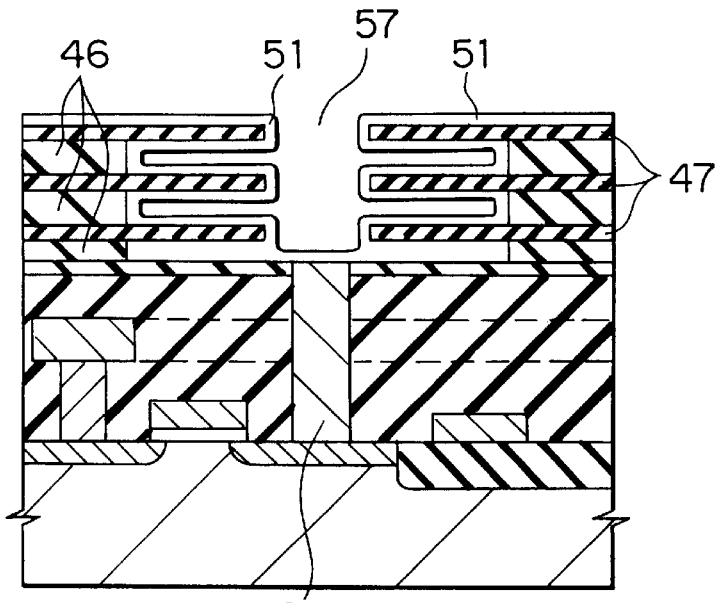

As illustrated in FIG. 7D, the corrugated shaped electrode film 51 is deposited to a thickness of 20 nm on an uppermost one of the second-kind spacer films 47 and the side walls of the internal space 57. In the illustrated example, the corrugated shaped electrode film 51 is formed by a polysilicon film which is deposited by the use of a low pressure CVD method and which includes phosphor as an impurity.

Figure 7E:
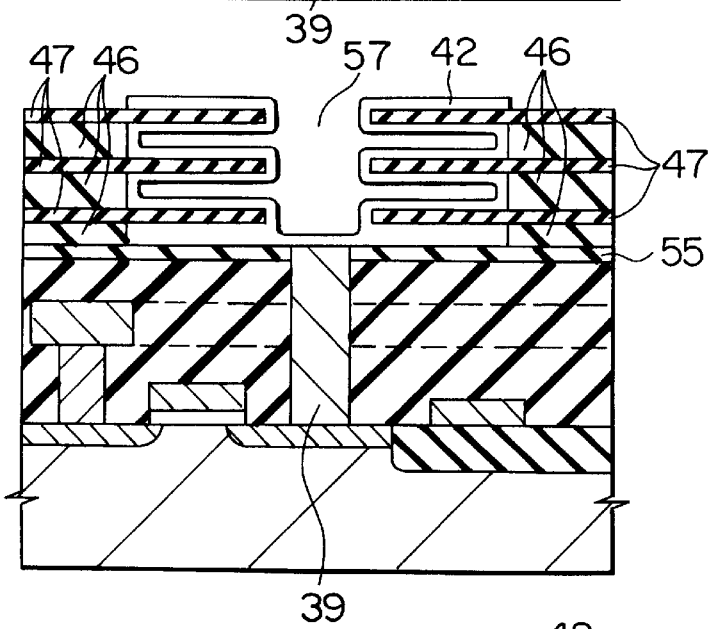

In FIG. 7E, the corrugated shaped electrode film 51 is subjected to anisotropic etching to partially remove an uppermost portion from the corrugated shaped electrode film and to form the corrugated electrode 42. From this fact, it is readily understood that the corruaged electrode 42 has a configuration which is determined in section by the configurations of the side walls of the internal space 57. As shown in FIG. 7E, the corrugated electrode 42 is electrically connected to the capacity contact plug 39.

Figure 7F:
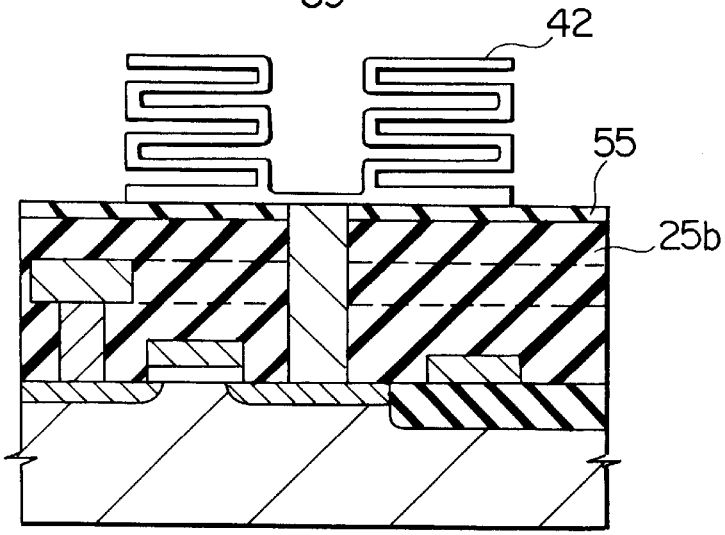

As illustrated in FIG. 7F, the first-kind and the second-kind spacer films 46 and 47 which are left on the mask insulation film 55 are subsequently removed by wet etching which uses a chemical solution of a species of fluroric acids. In this event, the mask insulation film 55 serves to protect the second partial interlayer insulation film 25b from being etched during the wet etching. Thus, the corrugated electrode 42 is manufactured through the above-mentioned processes or steps and is operable as the storage electrode of a single capacitor.

Thereafter, the capacitor insulation film and the plate electrode are successively formed in the manner mentioned in conjunction with FIGS. 4A through 4F.

Figure 8:
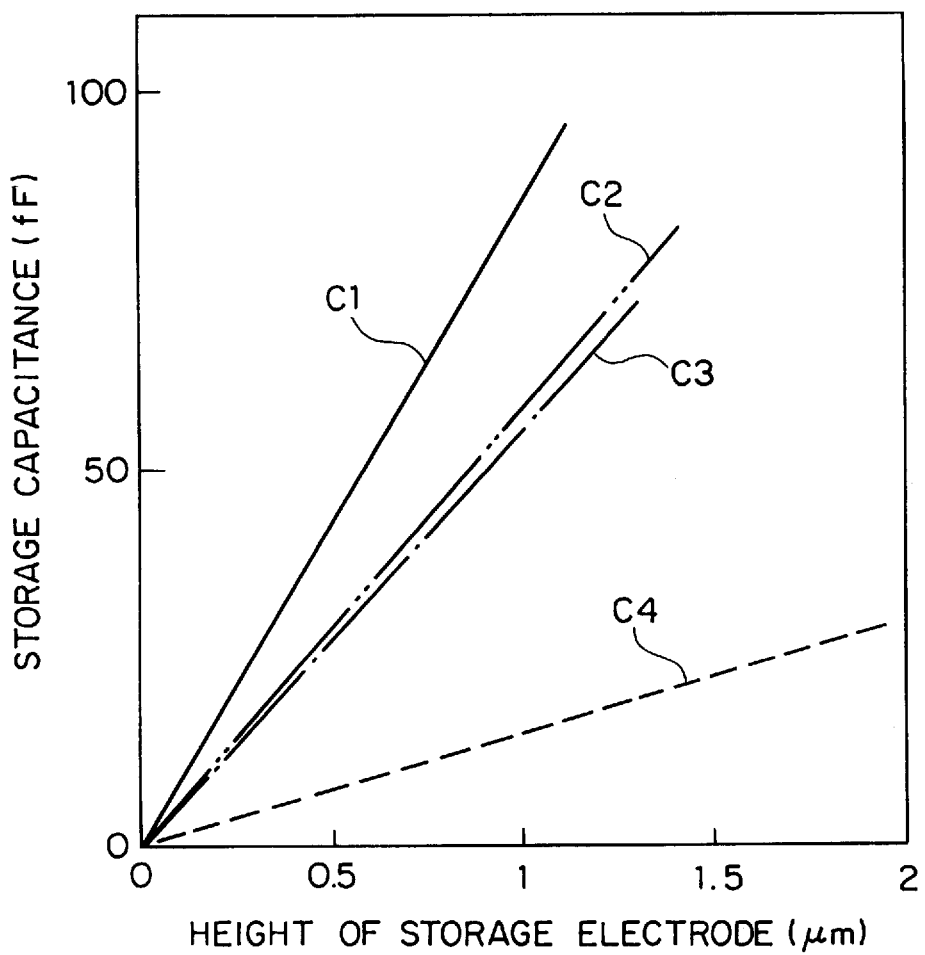
FIG. 8 is a graphical representation for use in comparing a characteristic of the semiconductor device according to this invention with those of the conventional semiconductor devices.

Referring to FIG. 8, wherein the abscissa and the ordinate represent a height of the storage electrode of the capacitor and a storage capacity (fF) of the capacitor, respectively, description will be made about a merit of the capacitor which is manufactured in the manner described with reference to FIGS. 4A through 4F and FIGS. 7A through 7F and which is used for a memory cell of 1 GDRAM. The capacitor has a size of 0.3×0.5 (micron meter) on a flat surface and a capacity insulation film which has a thickness of 4 nm when the thickness is represented in terms of a thickness of the silicon oxide film.

In FIG. 8, a characteristic of the capacitor of this invention is specified by a real line curve C1. For comparison, the conventional capacitors illustrated in FIGS. 1 and 2 have characteristics specified by dot-and-dash lines C2 and C3, respectively, in FIG. 8. This shows that the curve C2 is representative of the characteristic of the conventional capacitor of the fin structure type which has three fins. On the other hand, the curve C3 is representative of the characteristic of the conventional capacitor of the multicylinder type which has three cylinders. In addition, a characteristic of a usual stacked capacitor with a cubic shape is specified by a curve C4.

As readily understood from FIG. 8, the capacitor according to this invention is remarkably greater in capacity than the other conventional capacitors which have the fin structure, the multicylinder structure, and the cubic shape. For example, when the height of the storage electrode is equal to 0.5 micron meter, the conventional capacitors of the fin structure and the multicylinder structure have capacitances between 25 and 30 fF while the capacitor according to this invention has a capacitance of 45 fF. Therefore, the capacitance of the capacitor according to this invention is approximately 1.5 and 1.8 times the capacitances of the conventional capacitors which have the fin structure and the multicylinder strucure.

Herein, let comparison be made as regards the heights of the capacitors according to this invention and the conventional capacitors. In this case, it has been understood from FIG. 8 that, even when the height of the capacitor according to this invention is lowered to a half of the heights of the coventional capacitors, a similar capacitance can be obtained by the capacitor according to this invention.

Practically, it has been usually designed that a capacitor has a capacitance of about 30 fF. In FIG. 8, when the capacitance becomes equal to 30 fF, the height of the storage electrode according to this invention is about 0.3 micron meter. On the other hand, the heights of the fin structure and the multicylinder structure fall within a height between 0.5 and 0.6 micron meter. In addition, when the cubic structure is adopted, the height of the storage electrode is about 2 micron meters and is higher than that of the storage electrode according to this invention.

Figure 9:
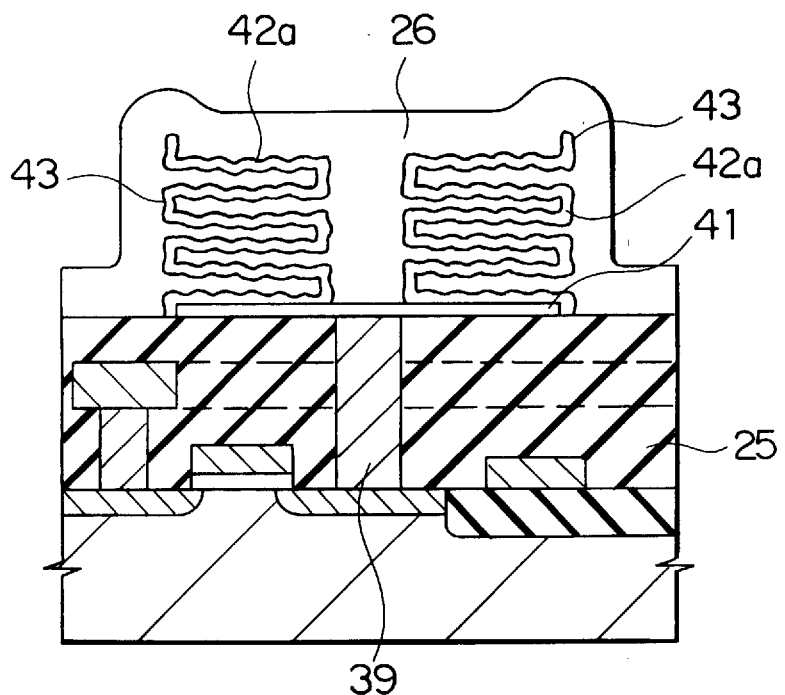
FIG. 9 shows a sectional view of a semiconductor device according to a second embodiment of this invention.

Referring to FIG. 9, a semiconductor device according to a second embodiment of this invention is similar in structure to that illustrated in the capacitor illustrated in FIGS. 3A and 3B except that a capacitor illustrated in FIG. 9 is somewhat different from that of FIGS. 3A and 3B. In FIG. 9, an underlying film 41 is formed on and is electrically connected to a capacity contact plug 39 and a modified corrugated electrode 42a is electrically connected to the underlying film 41.

In the illustrated example, it is to be noted that the modified corrugated electrode 42a has an uneven or irregular surface, as shown in FIG. 9. Such an irregular surface can be formed in the following manners. At first, the corrugated electrode 42 is fabricated by an amorphous silicon film which includes phosphor as an impurity. Thereafter, the corrugated electrode 42 of amorphous silicon is subjected to a heat treatment at a processing temperature between 600 and 700 C. within a processing chamber. During the heat treatment, the processing chamber is kept at a high vacuum which is equal to or lower than $10^{-5}$ Torr. Under the circumstances, the surface of the corrugated film 42 of amorphous silicon is roughened to form polysilicon grains which have diameters of about 5 nm. As a result, the corrugated electrode 42 is rendered into the modified corrugated electrode 42a which has the irregular surface, as mentioned before.

It has been found out that a surface area of such a modified corrugated electrode 42a is more than two times the surface area of the corrugated electrode 42 which is unmodified. With this structure, a large capacitance can be accomplished with a height of the storage electrode reduced.

Figure 10:
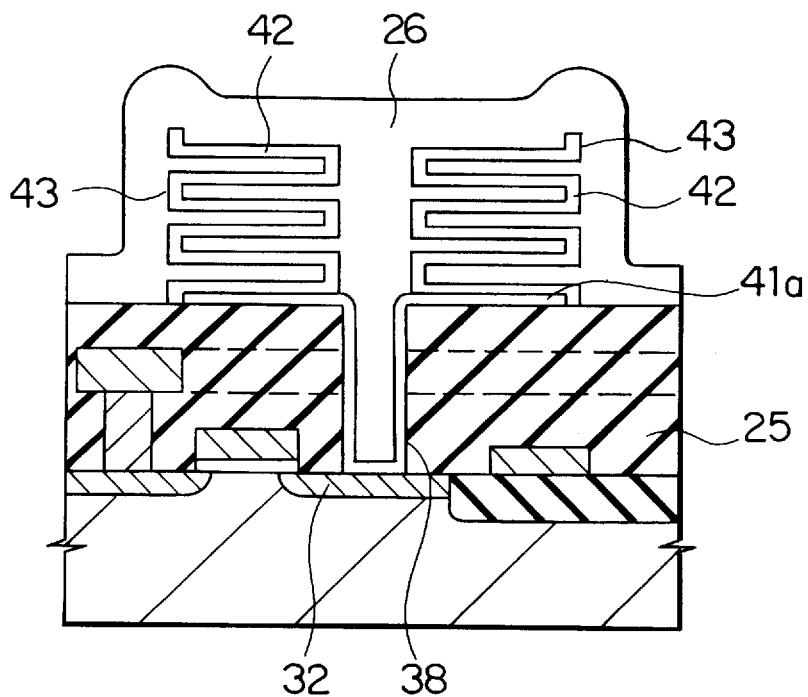
FIG. 10 shows a similar view of a semiconductor device according to a third embodiment of this invention.

Referring to FIG. 10, a semiconductor device according to a third embodiment of this invention is similar in structure to that illustrated in FIG. 3A and 3B except that a capacitor is somewhat changed in FIG. 10. More specifically, a capacity contact hole 38 is perforated through the interlayer insulation film 25 and reaches the second diffusion layer 32, as shown in FIG. 10. In other words, the capacity contact hole 38 is defined by a side wall portion formed by the interlayer insulation film 25 and a bottom portion formed by the second diffusion layer 32.

In this situation, an underlying film 41a is deposited on the side wall portion and the bottom portion of the capacitor contact hole 38 and on the surface of the interlayer insulation film 25. The underlying film 41a is formed by a polysilicon film which is doped with phosphor as an impurity and has a thickness of 20 nm or so. On the other hand, the capacity contact hole 38 has a diameter of about 200 nm.

The corrugated electrode 42 is mounted on and is electrically connected to the underlying film 41a to form the storage or the first electrode of the capacitor. With this structure, the underlying film 41a has a portion which is extended within the capacity contact hole 38 also and which is used as a part of the storage electrode. In this event, a capacitance becomes large with an increase of the diameter of the capacity contact hole 38.

As mentioned before, the corrugated or the modified corrugated electrode 42 or 42a is fabricated by the use of the mold which is formed by selectively etching one of two different insulation films stacked one another by the selective vapor HF etching. Using the selective vapor HF etching is effective to increase a ratio between the etching rates of the two different insulation films. For example, the ratio between the etching rates is equal to or higher than 1000. Accordingly, such a mold can be readily manufactured and can be precisely controlled. This eventually brings about the corrugated electrode which is stably and precisely controlled.

While this invention has thus far been described in conjunction with several embodiments thereof, it will readily be possible for those skilled in the art to put this invention into practice in various other manners. For example, the corrugated electrode may be formed by a metal material, such as titanium nitride, although the above description has been restricted to the corrugated electrode of polysilicon doped with an $N^+$ type impurity. In addition, the first-kind spacer films 46 and the second-kind spacer films 47 may not be restricted to the combination of the silicon oxide films including the impurity and the silicon oxide films including no impurity but may be structured by different etching rates when a ratio of the etching rates is kept at a predetermined value. For instance, the first-kind spacer films 46 may be silicon oxide films while the second-kind spacer films 47 may be silicon nitride films. Alternatively, the first-kind spacer films 46 may be formed by the silicon oxide films while the second-kind spacer films 47, silicon oxide films which include excessive amounts of silicon atoms.

Furthermore, the corrugated electrode may not be of a rectangular shape on a flat plane but of a circular shape or a polygonal shape, such as a hexagonal shape or the like.

At any rate, the corrugated electrode looks like a stack of folded electrodes and serves as the storage electrode. The storage electrode of the capacitor according to this invention has strong mechanical strength and has an effective area wider than the conventional storage electrodes of the fin structure and the multicylinder structure. Such a strong structure of a storage electrode makes it possible to thin a thickness of the storage electrode and to facilitate fine patterning of the storage electrode.

Moreover, the capacitor according to this invention is low in height, which favorably enables a reduction of a level difference between the memory cell and a peripheral circuit. As a result, a solution has been given to the problem related to a focus margin required in the photolithography process. This shows that a degradation of resolution can be avoided by the above-mentioned structure.

What is claimed is:

1. A semiconductor device operable as a memory cell which comprises a transistor and a capacitor which is electrically connected to the transistor and which comprises a first electrode connected to the transistor, a second electrode opposite to the first electrode, and an insulator film interposed between the first and the second electrodes, characterized in that:

said first electrode comprises, in section, a corrugated electrode which is specified by a series of folded portions, wherein the corrugated electrode is formed by a conductive film which has an irregular surface.

2. A semiconductor device as claimed in claim 1, characterized in that:

the conductive film is composed of polysilicon doped with an impurity.

3. A semiconductor device as claimed in claim 1, characterized in that:

the corrugated electrode is defined by a corrugated wall of an electrical conductive material which includes the series of the folded portions and which surrounds a space therein.

4. A semiconductor device as claimed in claim 1, characterized in that:

the irregular surface is given by an arrangement of grains.

5. A semiconductor device as claimed in claim 4, characterized in that:

the grains are composed of polysilicon grains.

6. A semiconductor device operable as a memory cell which comprises a transistor and a capacitor which is electrically connected to the transistor and which comprises a first electrode connected to the transistor, a second electrode opposite to the first electrode, and an insulator film interposed between the first and the second electrodes, characterized in that:

said first electrode comprises, in section, a corrugated electrode which is specified by a series of folded portions, wherein the corrugated electrode is defined by a corrugated wall of an electrical conductive material which includes the series of the folded portions and which surrounds a space therein; and the first electrode further comprises an underlying film of a conductive material, characterized in that the corrugated electrode is electrically connected to the underlying film and has an exposed surface.

7. A semiconductor device as claimed in claim 6, characterized in that:

the insulator film is coated on the exposed surface of the corrugated electrode.

8. A semiconductor device as claimed in claim 7, characterized in that:

the insulator film is covered with the second electrode.

9. A semiconductor device as claimed in claim 8, characterized in that:

the second electrode is deposited on the insulator film and is opposite to the first electrode.

10. A semiconductor device as claimed in claim 6, characterized in that:

the corrugated electrode is formed by a conductive film.

11. A semiconductor device as claimed in claim 10, characterized in that:

the film is composed of polysilicon doped with an impurity.

12. A semiconductor device operable as a memory cell which comprises a transistor and a capacitor which is electrically connected to the transistor and which comprises a first electrode connected to the transistor, a second electrode opposite to the first electrode, and an insulator film interposed between the first and the second electrodes, characterized in that:

said first electrode comprises, in section, a corrugated electrode which is specified by a series of folded portions, and characterized in that:

the transistor comprises:

a first region diffused into a semiconductor substrate;

a second region diffused into the semiconductor substrate with a channel region left in the semiconductor substrate between the first and the second regions;

a gate insulation film on the channel region;

a gate electrode deposited on the gate insulation film;

a bit line electrically connected to the first region;

a word line connected to the gate electrode; and an electrical conductor which electrically connects the second region of the transistor to the first electrode of the capacitor.

13. A semiconductor device as claimed in claim 12, characterized in that:

said electrical conductor is formed by a contact plug extended between the second region and the first electrode.

14. A semiconductor device as claimed in claim 13, characterized by:

an interlayer insulator covered on the first and the second regions, the gate insulation film, and the gate electrode wherein the contact plug, the bit line, and the word line are embedded within the interlayer insulator.

15. A semiconductor device as claimed in claim 12, characterized in that:

the first electrode of the capacitor comprises an underlying film underlying the corrugated electrode;

the electrical conductor being formed by an extension of the underlying film extended to the second region.

16. A semiconductor device as claimed in claim 12, characterized in that:

the corrugated electrode is formed by a conductive film.

17. A semiconductor device as claimed in claim 16, characterized in that:

the conductive film is composed of polysilicon doped with an impurity.

18. A semiconductor device operable as a memory cell which comprises a transistor and a capacitor which is electrically connected to the transistor and which comprises a first electrode connected to the transistor, a second electrode opposite to the first electrode, and an insulator film interposed between the first and the second electrodes, characterized in that:

said first electrode comprises, in section, a corrugated electrode which is specified by a series of folded portions, wherein said second electrode envelopes said first electrode and said insulator film.

* * * * *